United States Patent
Wang (10) Patent No.: US 9,722,208 B2
(45) Date of Patent: Aug. 1, 2017

(54) LIGHT-EMITTING DEVICES USING THIN FILM ELECTRODE WITH REFRACTIVE INDEX OPTIMIZED CAPPING LAYER FOR REDUCTION OF PLASMONIC ENERGY LOSS

(71) Applicant: Konica Minolta Laboratory U.S.A., Inc., San Mateo, CA (US)

(72) Inventor: Leiming Wang, Foster City, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days.

(21) Appl. No.: 14/984,857

(22) Filed: Dec. 30, 2015

(65) Prior Publication Data

US 2016/0190518 A1    Jun. 30, 2016

Related U.S. Application Data (60) Provisional application No. 62/098,424, filed on Dec. 31, 2014.

(51) Int. Cl.
  *H01L 21/52* (2006.01)
  *H01L 51/52* (2006.01)
  *H01L 51/50* (2006.01)

(52) U.S. Cl.
  CPC ...... *H01L 51/5268* (2013.01); *H01L 51/5004* (2013.01); *H01L 51/5234* (2013.01); *H01L 51/5262* (2013.01); *H01L 51/5275* (2013.01); *H01L 2251/558* (2013.01)

(58) Field of Classification Search
  CPC .................................................. H01L 51/5262
  See application file for complete search history.

(56) References Cited

U.S. PATENT DOCUMENTS

| | | | |
|---|---|---|---|
| 6,414,431 B1 | 7/2002 | Yu et al. | |
| 8,384,102 B2 | 2/2013 | Michellys | |
| 9,366,787 B2 * | 6/2016 | Lu | ........................ G02B 5/0242 |
| 2006/0035015 A1 | 2/2006 | Raychaudhuri et al. | |
| 2007/0159087 A1 | 7/2007 | Lee et al. | |
| 2007/0222371 A1 | 9/2007 | Raychaudhuri et al. | |

(Continued)

FOREIGN PATENT DOCUMENTS

| | | |
|---|---|---|
| EP | 1 076368 A2 | 2/2001 |
| WO | 2014077093 A1 | 5/2014 |

OTHER PUBLICATIONS

H. Riel, et al.; "Tuning the emission characteristics of top-emitting organic light-emitting devices by means of a dielectric capping layer: An experimental and theoretical study"; Journal of Applied Physics; vol. 94; pp. 5290-5296; 2003 (8 pages).

(Continued)

*Primary Examiner* — Yu-Hsi D Sun
(74) *Attorney, Agent, or Firm* — Osha Liang LLP (57) ABSTRACT

A light emitting device includes a substrate, a first electrode disposed on the substrate, a light emission layer (EML) disposed on the first electrode, a second electrode disposed on the EML, and a capping layer disposed on the second electrode. A thickness of the second electrode is not more than 50 nm, a refractive index of the capping layer is less than a refractive index of the EML, and the EML and the second electrode are separated by a distance not more than 100 nm.

22 Claims, 11 Drawing Sheets

(56) References Cited

U.S. PATENT DOCUMENTS

| | | | |
|---|---|---|---|
| 2007/0285010 A1* | 12/2007 | Lee | H01L 51/0037 |
| | | | 313/504 |
| 2008/0122348 A1 | 5/2008 | Jeong et al. | |
| 2014/0264311 A1* | 9/2014 | Lang | H01L 51/524 |
| | | | 257/40 |
| 2015/0270325 A1* | 9/2015 | Rossini | H01L 27/3276 |
| | | | 257/40 |
| 2016/0190518 A1* | 6/2016 | Wang | H01L 51/5268 |
| | | | 257/40 |
| 2016/0260920 A1* | 9/2016 | Rausch | H01L 51/0078 |

OTHER PUBLICATIONS

Wu Zhijun, et al.; "Top-emitting organic light-emitting devices with improved light outcoupling and angle-independence"; Journal of Physics D: Applied Physics; vol. 39; pp. 5160-5163; 2006 (4 pages).

L.S. Hung, et al.; "Application of an ultrathin LiF/Al bilayer in organic surface-emitting diodes"; Applied Physics Letters; vol. 78; pp. 544-546; 2001 (3 pages).

Hyunsu Cho, et al.; "Highly transparent organic light-emitting diodes with a metallic top electrode: the dual role of a Cs2CO3 layer"; Optics Express; vol. 19; pp. 1113-1121; 2011 (9 pages).

\* cited by examiner

LIGHT-EMITTING DEVICES USING THIN FILM ELECTRODE WITH REFRACTIVE INDEX OPTIMIZED CAPPING LAYER FOR REDUCTION OF PLASMONIC ENERGY LOSS

CROSS-REFERENCE TO RELATED APPLICATIONS

This application claims priority under 35 U.S.C. §119(e) to U.S. Provisional Patent Application Ser. No. 62/098,424, filed on Dec. 31, 2014, and entitled: "LIGHT-EMITTING DEVICES USING THIN FILM ELECTRODE WITH REFRACTIVE INDEX OPTIMIZED CAPPING LAYER FOR REDUCTION OF PLASMONIC ENERGY LOSS." U.S. Provisional Patent Application Ser. No. 62/098,424 is hereby incorporated in its entirety.

FIELD OF THE INVENTION

The present invention relates generally to light emitting devices.

BACKGROUND

Light emitting devices may generate light in response to an applied current or voltage. A light emitting device may include a light generation source. The light generation source may be, for example, a filament, used in incandescent light emitting devices, or an emission layer (abbreviated as EML hereinafter), used in organic light emitting diodes (OLED). Only a fraction of the light generated by the light generation source of a light emitting device may leave the light emitting device. The remaining fraction of the light generated by the light emitting device that does not leave the light emitting device may be converted to heat or otherwise not contribute to the quantity of light emitted by the light emitting device.

For a multi-layered light emitting device, such as light emitting diodes including inorganic light emitting diodes (LED) and organic light emitting diodes (OLED), a number of mechanisms may contribute to the remaining fraction of light that does not leave the light emitting device. The mechanisms may trap a majority of the light emitted by an EML within the multi-layered light emitting device. Due to the layered structure of a multi-layered light emitting device, light emitted by the EML within the light emitting device may become trapped within one or more layers of the light emitting device, e.g., due to waveguide modes, or absorbed by a metal electrode, e.g., by a plasmon mode.

For example, a conventional OLED may include several organic material layers sandwiched between an anode and a cathode. The OLED may only emit approximately 20% of the light emitted by the EML. The rest of the light emitted by the EML is either trapped inside one of the organic layers (commonly referred to as a waveguide mode), trapped inside a substrate (commonly referred to as a substrate mode), or absorbed by the cathode (commonly referred to as a plasmon mode).

Among the aforementioned trapping or loss mechanisms, the plasmon mode (sometimes referred to as plasmonic loss) may absorb approximately 40% of the light emitted by the EML and thus, substantially reduces the quantity of light emitted by the light emitting device. Reducing the plasmonic loss of a multilayer light emitting device may increase the quantity of light emitted by the multilayer light emitting device and improve the efficiency of the multilayer light emitting device.

Multilayer light emitting devices are conventionally categorized as either top emitting or bottom emitting. Multilayer light emitting devices are categorized as bottom emitting devices if light emitted by the EML is emitted out of the light emitting device by passing through a transparent or semi-transparent bottom electrode that is disposed on a substrate on which the light emitting device was fabricated. Multilayer light emitting devices are categorized as top emitting devices if light emitted by the EML is emitted out of the light emitting device by passing through a lid added to the light emitting device after fabrication.

Plasmon loss in light emitting devices may be reduced by replacing the regular bulk (or thick) metal electrode with a thin metal film. However, existing thin metal film electrode structures, as known in the art, are only directly applicable to top emitting devices. Thin metal film electrode structures, as known in the art, for bottom emitting structures require a mirror layer on a top side of the structure.

SUMMARY OF THE INVENTION

In one aspect, a light emitting device according to one or more embodiments may comprise: a substrate; a first electrode disposed on the substrate; a light emission layer (EML) disposed on the first electrode; a second electrode disposed on the EML; and a capping layer disposed on the second electrode, wherein a thickness of the second electrode is not more than 50 nm, wherein a refractive index of the capping layer is less than a refractive index of the EML, and wherein the EML and the second electrode are separated by a distance not more than 100 nm.

Other aspects of the invention will be apparent from the following description and the appended claims.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

Embodiments of the invention relate to light emitting devices. Light emitting devices, such as an LED or OLED as known in the art, have low emission efficiencies due to light trapping or other loss mechanisms within the light emitting device.

Figure 1:
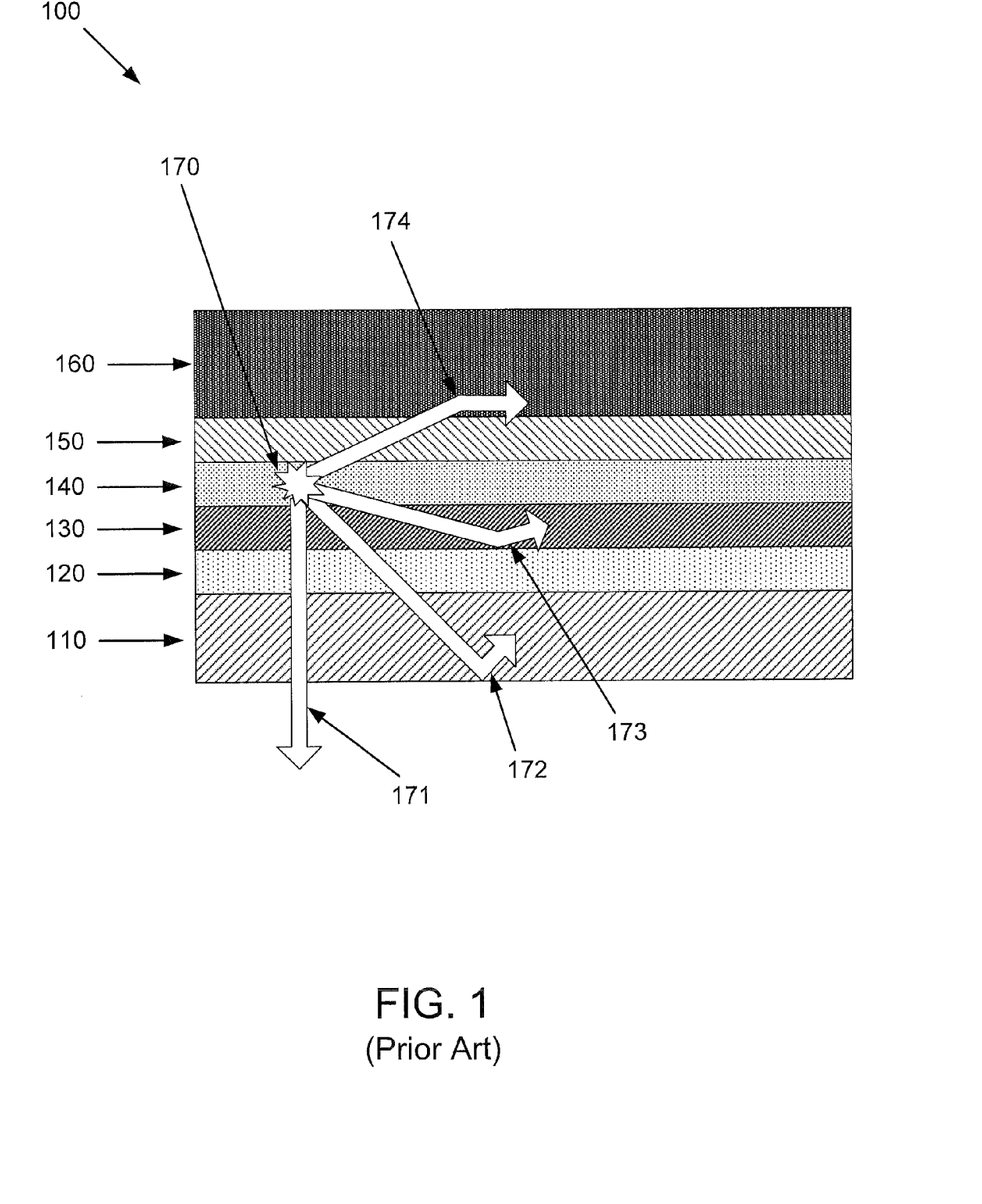
FIG. 1 shows a ray diagram of an organic light emitting diode.

FIG. 1 shows a diagram of a typical bottom-emitting OLED structure (100) as known in the art. The OLED (100) is a multi-layer device and includes a substrate (110), anode (120), hole transport layer (130), EML (140), electron transport layer (150), and cathode (160), as known in the art. When light (170) is emitted by the EML (140), a first portion (171) is transmitted through the OLED (100) and emitted. Other portions of the light (170) become trapped within the OLED (100) due to reflections at the interfaces of the layers based on differences in the refractive index of each layer and/or absorbed by the OLED in the form of various electromagnetic modes.

For example, a second portion (172) of the light (170) may reflect at the substrate (110)—air interface and become trapped within the substrate (110) as a substrate mode. Similarly, a third portion (173) of the light (170) may reflect from the anode (120)—hole transport layer (130) interface and become trapped inside the multiple organic layers (130, 140, 150) as a waveguide mode.

A fourth portion (174) of the light (170) may be received by the cathode (160) and may excite a surface plasmon mode along the cathode (160)—electron transport layer (150) interface. The excited surface plasmon mode may prevent the fourth portion (174) of the light (170) from being emitted by the OLED (100). Other details of the conventional OLED and its conventional constituent layers are known to those of ordinary skill in the art, and are therefore omitted here.

Embodiments of the invention relate to light emitting devices comprising a thin film cathode and a capping layer. The thin film cathode and capping layer may reduce the plasmonic loss of the light emitting device when compared with the plasmonic loss of a conventional LED or OLED, as known in the art. The cathode and capping layer may reduce the portion of light emitted by the EML that is confined to a surface plasmon mode. By reducing the quantity of light confined to a surface plasmon mode, the quantity of light emitted by the light emitting device may be increased when compared to the quantity of light emitted by a conventional LED or OLED, as known in the art. Thus, a light emitting device according to one or more embodiments of the invention may have improved emission efficiency when compared to LEDs or OLEDs as known in the art.

Figure 2:
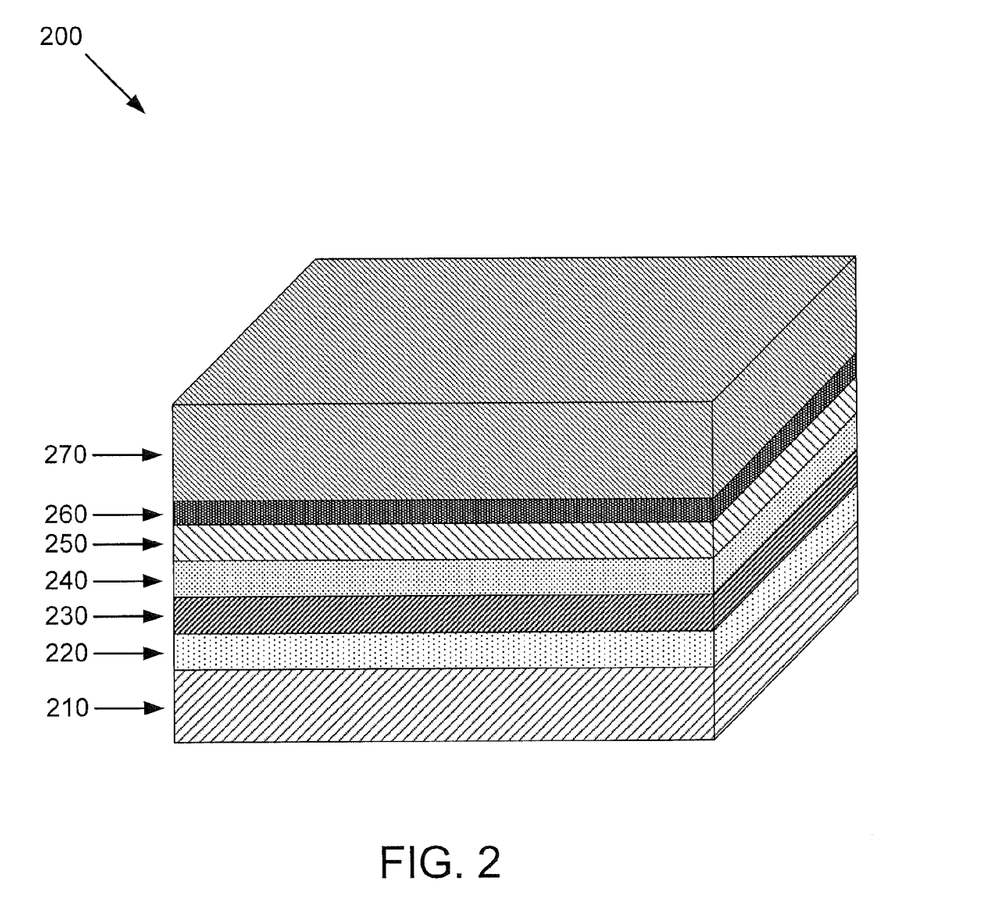
FIG. 2 shows a light emitting device in accordance with one or more embodiments of the invention.

FIG. 2 shows a light emitting device (200) in accordance with one or more embodiments of the invention. Specifically, FIG. 2 shows the light emitting device (200) including a number of layers. The layers may include a substrate (210), anode (220) disposed on the substrate (210), EML (240) disposed on the anode (220), thin film cathode (260) disposed on the EML (240), and capping layer (270) disposed on the cathode (260). The cathode (260) and EML (240) may be separated by a distance not more than 100 nm.

In addition, the light emitting device (200) may include a hole transport layer (230) disposed between the anode (220) and EML (240), and an electron transport layer (250) disposed between the EML (240) and cathode (260). A thickness of the electron transport layer (250), which is disposed on the EML (240), may be not more than 100 nm. The term "disposed on" as used herein can mean either that one layer is directly disposed on another layer or that one layer is indirectly disposed on another layer with other layer(s) disposed therebetween. For example, the hole transport layer (230) shown in the example of FIG. 2 is "disposed on" both the substrate (210) and the anode (220); that is, the anode (220) is disposed between the substrate (210) and the hole transport layer (230).

One of ordinary skill will appreciate that the layers of the light emitting device (200) may be made from a number of different materials. For example, the substrate (210) may be made of glass and the anode (220) may be made of indium tin oxide. The hole transport layer (230) may be made of N,N'-bis(naphthalen-1-yl)-N,N'-bis(phenyl)-benzidine (NPB), the EML may be made of fluorescent or phosphorescent emitting materials, and the electron transport layer may be made of tris(8-hydroxyquinoline) aluminum (III) (Alq3). Furthermore, one of ordinary skill will appreciate that the cathode (260) may be made of any suitable metal, e.g., silver, gold, or aluminum. In addition, one of ordinary skill in the art will appreciate that the EML may itself be formed of several layers, each having a different band of emission wavelength, e.g., a red emission layer, a green emission layer, and a blue emission layer (not shown). Furthermore, one of ordinary skill will appreciate that the multiple layers in the device may be manufactured by any known manufacturing process, for example, vacuum deposition or solution process.

In one or more embodiments of the invention, the thickness of the cathode (260) and the refractive index of the capping layer (270) are chosen to reduce the quantity of light confined to a surface plasmon mode. By reducing the quantity of light confined to a surface plasmon mode, the quantity of light emitted by the light emitting device (200) may be improved.

Numerical simulations were conducted to determine the thickness of the cathode (260) and the refractive index of the capping layer (270). FIGS. 3A-6B show the simulation geometries and the results of each numerical simulation. More specifically, FIGS. 3B, 4B, 5B, and 6B show grayscale intensity plots of the square of the magnitude of the electric field for each of the corresponding simulation geometries shown in FIGS. 3A, 4A, 5A, and 6A. In each of FIGS. 3B, 4B, 5B, and 6B, darker shading indicates a larger square of the magnitude of the electric field. The square of the magnitude of the electric field is directly proportional to light intensity.

Figure 3A:
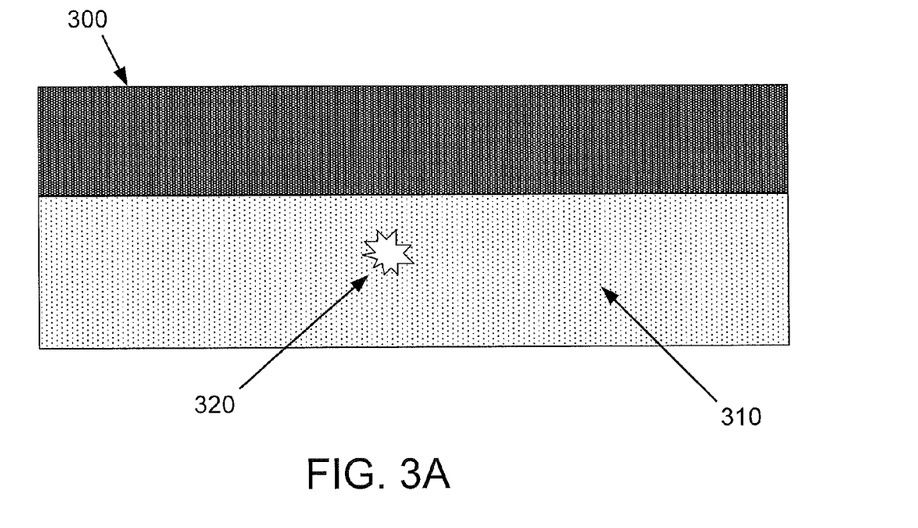
FIG. 3A shows a simulation geometry corresponding to the cathode structure of a conventional light emitting device.

FIG. 3A shows a first simulation geometry. The first simulation geometry is a 2-layer system including a first half space (300) of silver corresponding to a bulk or thick electrode as known in the art. The first simulation geometry also includes a second half space (310) having a refractive index of 1.76 corresponding to a light emission layer. The refractive index corresponds to the refractive index of the EML (140, FIG. 1). The first simulation geometry includes a point source (320) separated from the layer interface by 60 nm. The point source (320) is an electric dipole oriented perpendicular to the first half space (300)—second half space (310) interface. The simulation geometry shown in FIG. 3A may correspond to a LED or OLED bulk (or thick) cathode structure as known in the art.

Figure 3B:
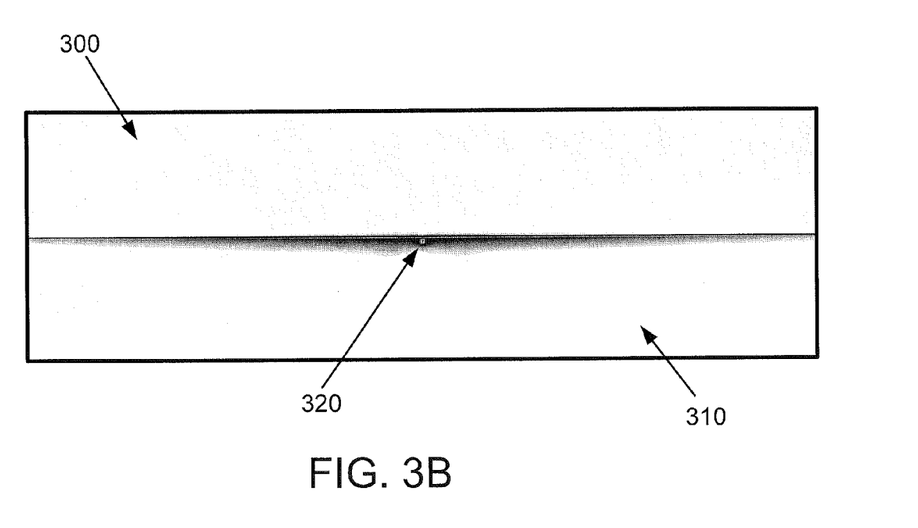
FIG. 3B shows a plot of simulation data corresponding to the cathode structure of a conventional light emitting device.

FIG. 3B shows the result of numerically simulating the first simulation geometry. Specifically, FIG. 3B shows a plot of the simulated square of the magnitude of the electric field when the point source (320) radiates light having a vacuum wavelength of 535 nm. As seen from the plot, the radiated electric field is generally confined to the first half space (300)—second half space (310) interface and decays as the distance from the point source (320) increases. The aforementioned field distribution indicates the radiated electric field is coupled to a surface plasmon mode of the interface and lost as heat. Accordingly, little light is radiated into free space for the first simulation geometry. Thus, FIG. 3B indicates that LED or OLEDs having a bulk (or thick) metal cathode, as known in the art, have significant plasmonic loss and radiate only a small fraction of the generated light.

Figure 4A:
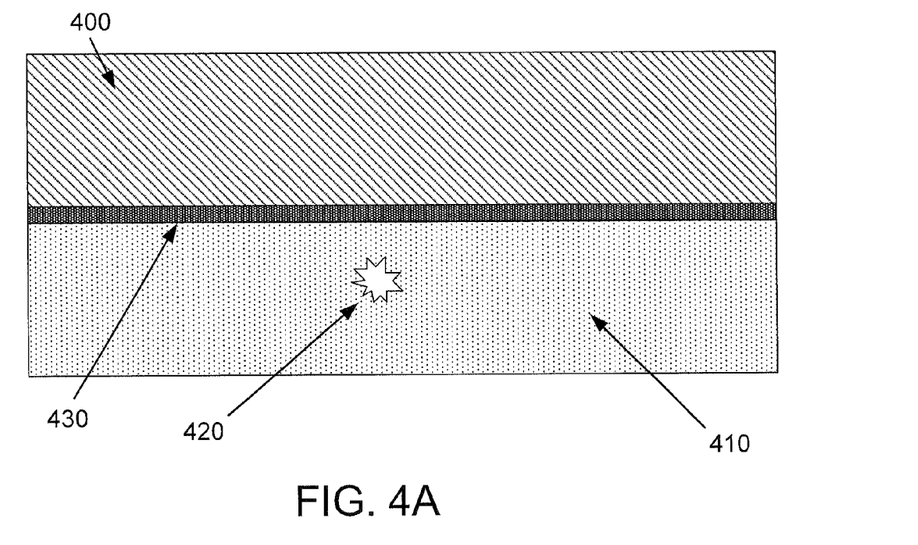
FIG. 4A shows a simulation geometry in accordance with one or more embodiments of the invention.

FIG. 4A shows a second simulation geometry. The second simulation geometry is a 3-layer system including a first half space (400) having a first refractive index, a second half space (410) having a second refractive index, and a metal layer (430) disposed between the first half space (400) and second half space (410). The first refractive index is 1.76 and the second refractive index is 1.76. The metal layer (430) is silver and has a thickness of 20 nm. The second simulation geometry includes a point source (420) disposed within the second half space (410) and separated from the metal layer (430) by 60 nm. The point source (420) is an electric dipole oriented perpendicular to the metal layer (430)—second half space (410) interface. The simulation geometry shown in FIG. 4A may correspond to a light emitting device (200, FIG. 2) having a capping layer (270, FIG. 2) with a refractive index approximately matched to the refractive index of the EML (240, FIG. 2).

Figure 4B:
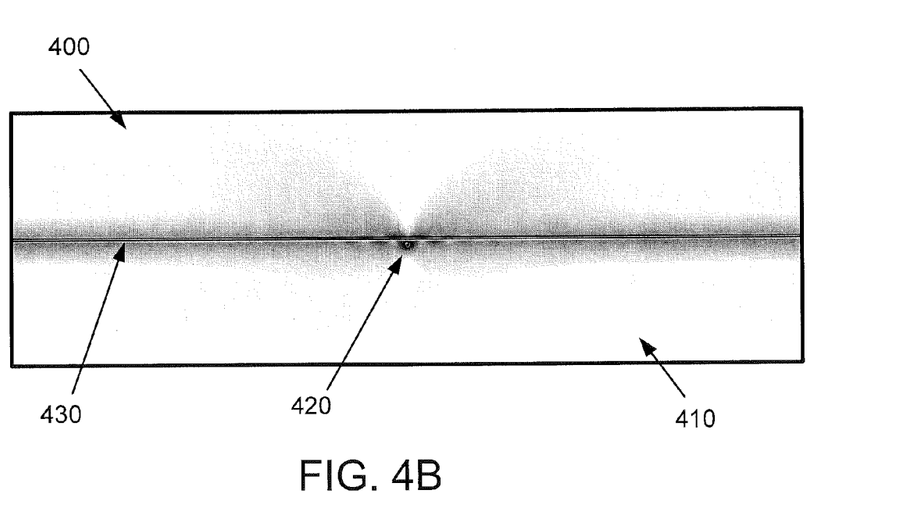
FIG. 4B shows a plot of simulation data in accordance with one or more embodiments of the invention.

FIG. 4B shows the result of numerically simulating the second simulation geometry. Specifically, FIG. 4B shows a plot of the simulated square of the magnitude of the electric field when the point source (420) radiates light having a vacuum wavelength of 535 nm. As seen from the plot, the electric field is generally confined to the metal layer (430) and portions of the first half space (400) and second half space (410) near the metal layer (430), e.g., the EML-silver-capping layer interfaces. The results indicate that the electric field strength decays as the distance from the point source (420) increases. The aforementioned field distribution shown in FIG. 4B indicates the radiated electric field is mainly coupled to a surface plasmon mode of the interface and lost as heat. Thus, FIG. 4B indicates that a light emitting device having a thin cathode (260, FIG. 2) and a capping layer (270, FIG. 2) having a refractive index that is approximately the same as the refractive index of the EML (240, FIG. 2) may also have significant plasmonic losses.

Figure 5A:
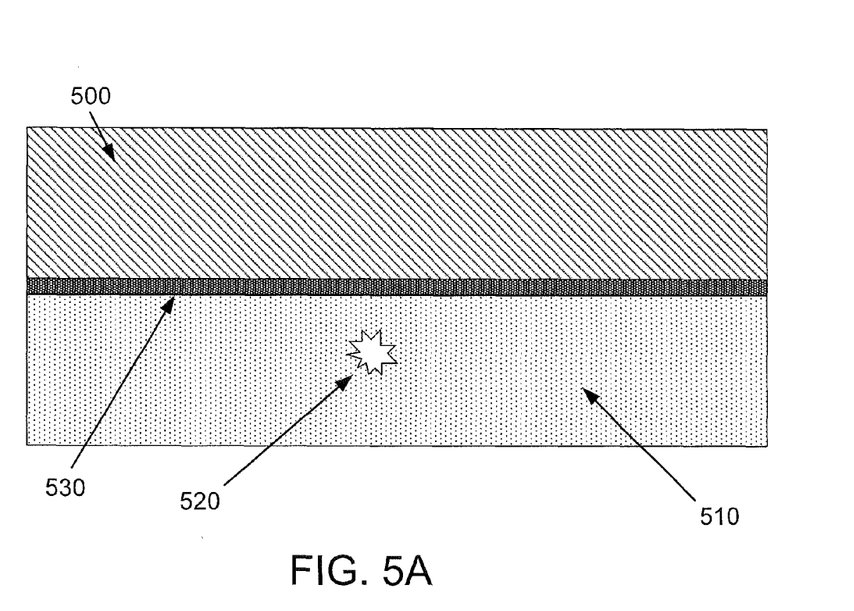
FIG. 5A shows a simulation geometry in accordance with one or more embodiments of the invention.

FIG. 5A shows a third simulation geometry. The third simulation geometry is a 3-layer system including a first half space (500) having a first refractive index, a second half space (510) having a second refractive index, and a metal layer (530) disposed between the first half space (500) and second half space (510). The first refractive index is 2.0 and the second refractive index is 1.76. The metal layer (530) is silver and has a thickness of 20 nm. The third simulation geometry includes a point source (520) disposed within the second half space (510) and separated from the metal layer (530) by 60 nm. The point source (520) is an electric dipole oriented perpendicular to the metal layer (530)—second half space (510) interface. The simulation geometry shown in FIG. 5A may correspond to a light emitting device (200, FIG. 2) having a capping layer (270, FIG. 2) with a refractive index greater than the refractive index of the EML (240, FIG. 2).

Figure 5B:
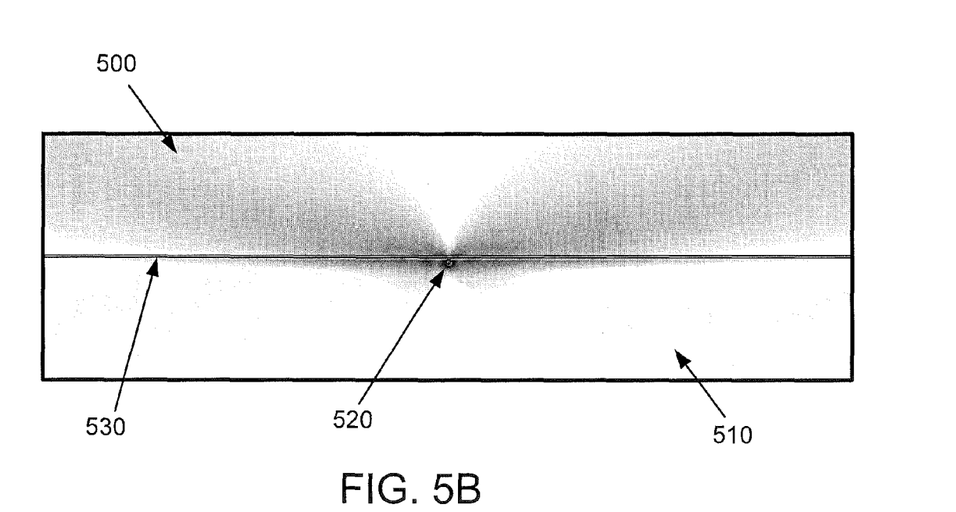
FIG. 5B shows a plot of simulation data in accordance with one or more embodiments of the invention.

FIG. 5B shows the result of numerically simulating the third simulation geometry. Specifically, FIG. 5B shows a plot of the simulated square of the magnitude of the electric field when the point source (520) radiates light having a vacuum wavelength of 535 nm. As seen from the simulated square of the magnitude of the electric field, a first portion of the electric field is confined to the metal layer (530) and portions of the first half space (500) and second half space (510) near the metal layer (530), e.g., the EML-silver-capping layer interfaces. The aforementioned field distribution associated with the first portion, shown in FIG. 5B, indicates the first portion of the electric field is coupled to a surface plasmon mode of the EML-silver-capping layer interfaces and lost as heat. A second portion of the electric field is radiated into the first half space (500) as indicated by the lighter shading above the metal layer (530). The aforementioned field distribution associated with the second portion, shown in FIG. 5B, indicates the second portion radiates as light. Thus, FIG. 5B indicates that a light emitting device (200, FIG. 2) having a thin cathode (260, FIG. 2) and a capping layer (270, FIG. 2) having a refractive index that is greater than the refractive index of the EML (240, FIG. 2) has a portion of the light coupled to surface plasmons that is reduced when compared to an LED or OLED having a thick cathode, as known in the art. Additionally, the light emission is mainly directed towards the capping layer (270, FIG. 2) side of the light emitting device (200, FIG. 2) and may be beneficial to plasmonic loss reduction for a top emitting device.

Figure 6A:
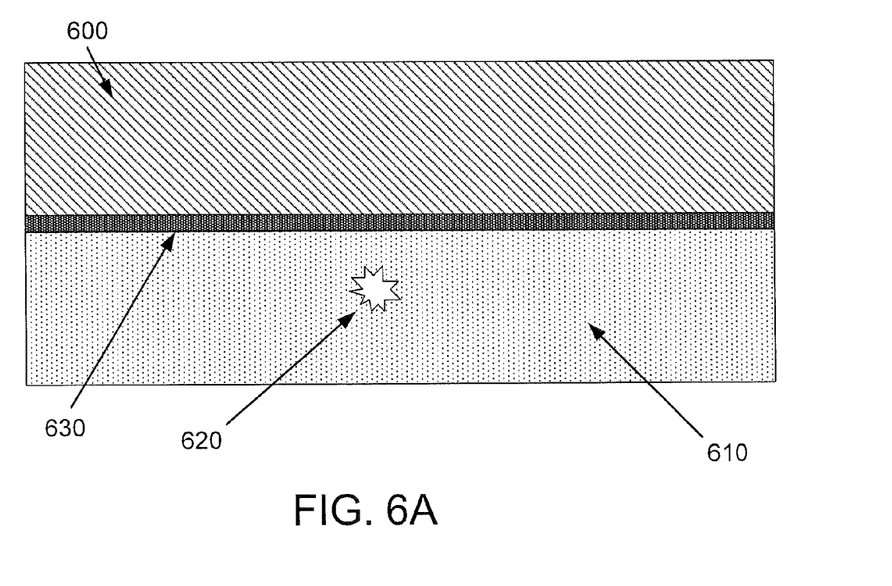
FIG. 6A shows a simulation geometry in accordance with one or more embodiments of the invention.

FIG. 6A shows a fourth simulation geometry. The fourth simulation geometry is a 3-layer system including a first half space (600) having a first refractive index, a second half space (610) having a second refractive index, and a metal layer (630) disposed between the first half space (600) and second half space (610). The first refractive index is 1.5 and the second refractive index is 1.76. The metal layer (630) is silver and has a thickness of 20 nm. The fourth simulation geometry includes a point source (620) disposed within the second half space (610) and separated from the metal layer (630) by 60 nm. The point source (620) is an electric dipole oriented perpendicular to the metal layer (630)—second half space (610) interface. The simulation geometry shown in FIG. 6A may correspond to a light emitting device (200, FIG. 2) having a capping layer (270, FIG. 2) with a refractive index less than the refractive index of the EML (240, FIG. 2).

Figure 6B:
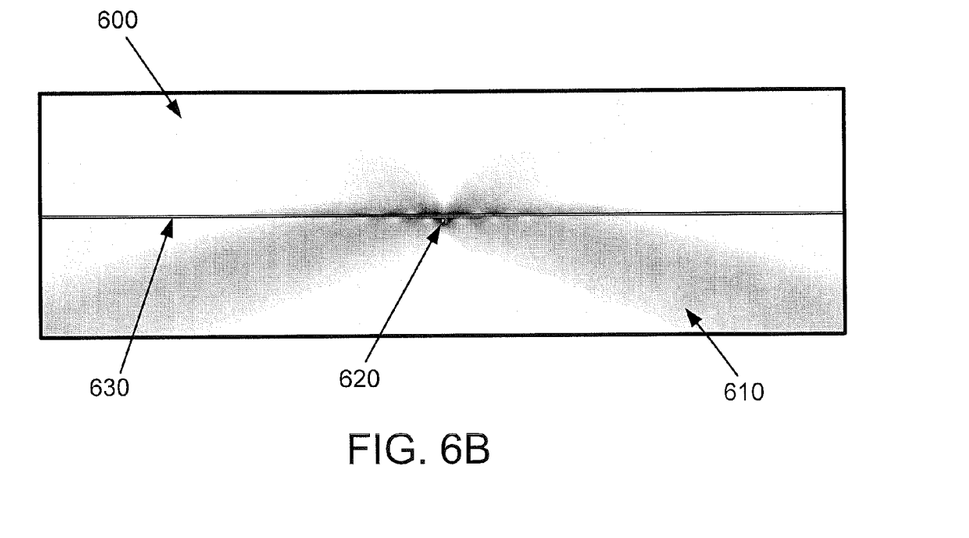
FIG. 6B shows a plot of simulation data in accordance with one or more embodiments of the invention.

FIG. 6B shows the result of numerically simulating the fourth simulation geometry. Specifically, FIG. 6B shows a plot of the simulated square of the magnitude of the electric field when the point source (620) radiates light having a vacuum wavelength of 535 nm. As seen from the simulated square of the magnitude of the electric field, a first portion of the electric field is confined to the metal layer (630) and portions of the first half space (600) and second half space (610) near the metal layer (630), e.g., the EML-silver-capping layer interfaces. The aforementioned field distribution associated with the first portion, shown in FIG. 6B, indicates the first portion of the electric field is coupled to a surface plasmon mode of the EML-silver-capping layer interfaces and lost as heat. A second portion of the electric field is radiated into the second half space (610) as indicated by the lighter shading below the metal layer (630). The aforementioned field distribution associated with the second portion, shown in FIG. 6B, indicates the second portion radiates as light. Thus, FIG. 6B indicates that a light emitting device (200, FIG. 2) having a thin cathode (260, FIG. 2) and a capping layer (270, FIG. 2) having a refractive index that is less than the refractive index of the EML (240, FIG. 2) has a portion of the light coupled to surface plasmons that is reduced when compared to an LED or OLED having a thick cathode, as known in the art. Additionally, the light emission is mainly directed towards the EML (240, FIG. 2) side of the light emitting device (200, FIG. 2) and may be beneficial to plasmonic loss reduction for a bottom emitting device.

In some applications, a bottom emitting light emitting device may be desirable as it is easier to fabricate than a top emitting or transparent light emitting device. Thus, in one or more embodiments of the invention, the thickness of the cathode (260, FIG. 2) and the refractive index of the capping layer (270, FIG. 2) are optimized to reduce plasmonic energy loss and enhance the light outcoupling through a side of the device corresponding to the EML side (240, FIG. 2). In one or more embodiments of the invention, the thickness of the cathode is between 10 and 30 nm thick. In one or more embodiments of the invention, the refractive index of the capping layer (270, FIG. 2) is set based on the refractive indexes of the electron transport layer (250, FIG. 2) and EML (240, FIG. 2). In one or more embodiments of the invention, the refractive index of the capping layer (270, FIG. 2) is set to be 1.4-1.6 and less than the refractive indexes of the electron transport layer (250, FIG. 2) and EML (240, FIG. 2). In one or more embodiments of the invention, the capping layer (270, FIG. 2) is silicon dioxide, barium fluoride, calcium fluoride, aluminum oxide, potassium bromide, polymethyl methacrylate, polyacrylate, or polycarbonate. Further, in one or more embodiments of the invention, a thickness of the capping layer (270) is greater than or equal to 650 nm.

To quantify the potential performance improvement of embodiments in plasmonic energy loss reduction for bottom emitting devices, additional numerical simulations were conducted. In the additional numerical simulations, the plasmonic loss and bottom emission percentage for a number of simulation geometries was calculated. The plasmonic loss can be defined as the ratio of the power lost to plasmon mode with respect to the total radiated power of a point source. In other words, plasmonic loss is the ratio of the power lost to the plasmon mode divided by the total power radiated by a point source. Further, the bottom emission percentage can be defined as the percentage of light radiated downward (into the EML half space, 610, FIG. 6) out of the total light radiated both upward (into the capping layer half space, 600, FIG. 6) and downward (into the EML half space, 610, FIG. 6). In other words, the bottom emission percentage is the ratio of downward radiated light power divided by the sum of the upward and downward radiated light power. For a geometry shown in FIG. 6, the sum of the upward and downward radiated light power is equal to the difference of the total radiated power by the point source and the power lost to plasmon mode.

In the additional simulations, the plasmonic loss for a simulation geometry shown in FIG. 6A was determined as the separation distance between the point source (620, FIG. 6A) and the second half space (610)—metal layer (630) interface was varied from 10 to 200 nm. For comparison, in the additional simulations, the plasmonic loss for a simulation geometry shown in FIG. 3A was determined as the separation distance between the point source (320, FIG. 3A) and the first half space (300)—second half space (310) interface was varied from 10 to 200 nm.

Figure 7:
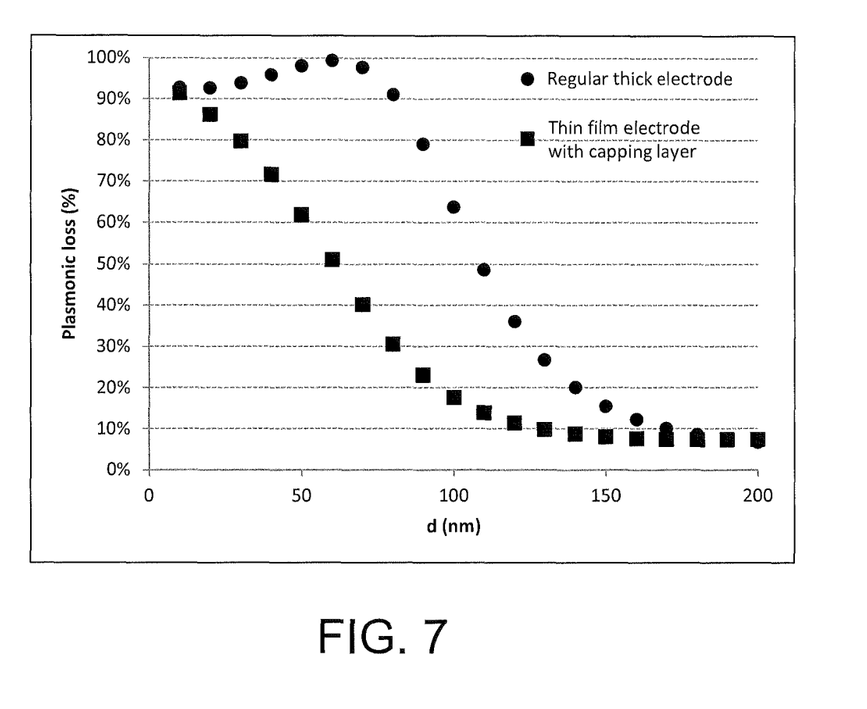
FIG. 7 shows a plot of simulation data in accordance with one or more embodiments of the invention.

FIG. 7 shows a plot of the plasmonic loss as discussed above. The plasmonic loss for the simulation geometry of FIG. 6A is indicated by square marks and the plasmonic loss for the simulation geometry of FIG. 3A is indicated by circular marks. The horizontal axis corresponds to the separation distance and the vertical axis corresponds to the magnitude of the determined plasmonic loss. As seen from FIG. 7, the plasmonic loss of a conventional light emitting device with bulk (or thick) cathode, corresponding to the simulation geometry shown in FIG. 3A, is larger than the plasmonic loss of the light emitting device with thin film cathode and a capping layer, corresponding to the simulation geometry shown in FIG. 6A. For example, for a separation distance of approximately 60 nm the plasmonic loss of the simulation geometry as in FIG. 3A is nearly 100%. In contrast, for simulation geometry as in FIG. 6A, corresponding to the light emitting device according to one or more embodiments of the invention, having a similar separation distance exhibits a plasmonic loss of 50%. Additionally, for a wide range of separation distances, the plasmonic loss of the thick electrode structure is much larger than for a thin film electrode.

In the additional simulations, the bottom emission percentage for a simulation geometry shown in FIG. 6A was determined as the separation distance between the point source (620, FIG. 6A) and the second half space (610)—metal layer (630) interface was varied from 10 nm to 200 nm. The bottom emission percentage was calculated for both a dipole source that is oriented parallel and a dipole source that is oriented perpendicular to the second half space (610)—metal layer (630) interface.

Figure 8:
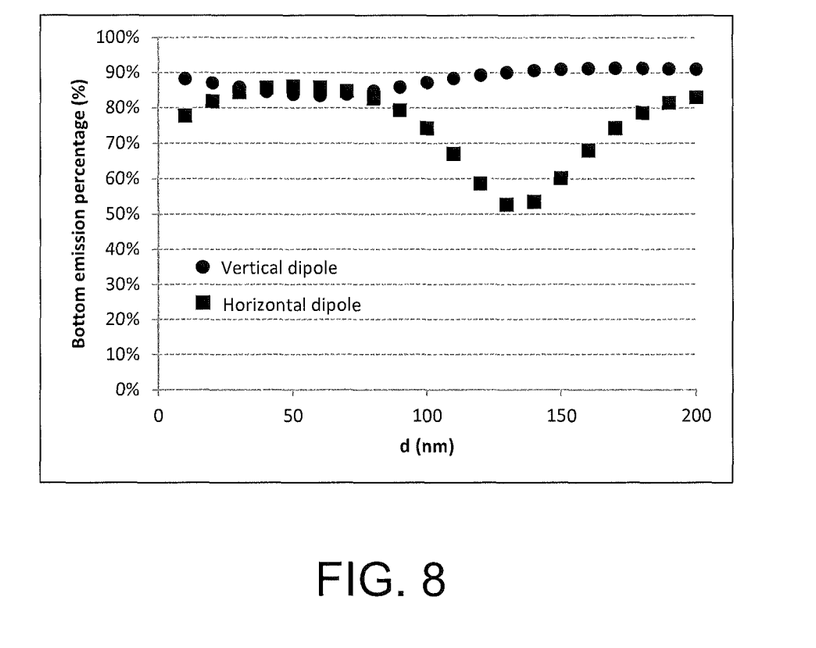
FIG. 8 shows a plot of simulation data in accordance with one or more embodiments of the invention.

FIG. 8 shows a plot of the bottom emission percentage versus the separation distance. In FIG. 8, the horizontal axis of the plot corresponds to the separation distance, and the vertical axis corresponds to the bottom emission percentage as described above. As seen from FIG. 8, the bottom emission percentage for both orientations of the dipole point source (620, FIG. 6) is approximately 85% for a separation distance between 20 nm and 80 nm. For example, for a separation distance of around 50 nm, the bottom emission percentage of a parallel dipole point source is approximately 88% and the bottom emission percentage of a perpendicular dipole point source is approximately 84%. Thus, a light emitting device having a thin film cathode with a capping layer corresponding to the geometry shown in FIG. 6A, in accordance with one or more embodiments of the invention, may be predominantly bottom emitting.

To further quantify the plasmonic loss and emission property from a light emitting device in accordance with one or more embodiments of the invention, a two dimensional parametric study was performed. In the study, the simulation geometry shown in FIG. 6A (corresponding to a thin metal film cathode structure with a capping layer) was parametrically studied by varying the refractive index of the first half space (600, FIG. 6A, corresponding to the capping layer) from 1 to 3 in steps of 0.1, and varying the thickness of the metal layer (630, FIG. 6A) from 10 to 50 nm in steps of 10 nm, while the refractive index of the second half space (610, FIG. 6A, corresponding to a EML layer or electron transport layer) is kept at 1.76. For each pair of parameters, a corresponding simulation model was simulated to determine a relative plasmonic loss percentage and bottom emission percentage of the simulation model. The relative plasmonic loss percentage is the ratio of the plasmonic loss percentage of the simulated structure divided by the plasmonic loss percentage of an equivalent simulation model as shown in FIG. 3A (corresponding to a bulk (or thick) cathode structure). In a multilayer light emitting device, the light emitting sources (e.g., phosphor molecules in an OLED) are usually randomly oriented with respect to the layer interface. Thus, in the parametric studies, the calculated plasmonic loss and the bottom emission percentage are the average of a perpendicular dipole point source and a parallel dipole point source.

Figure 9:
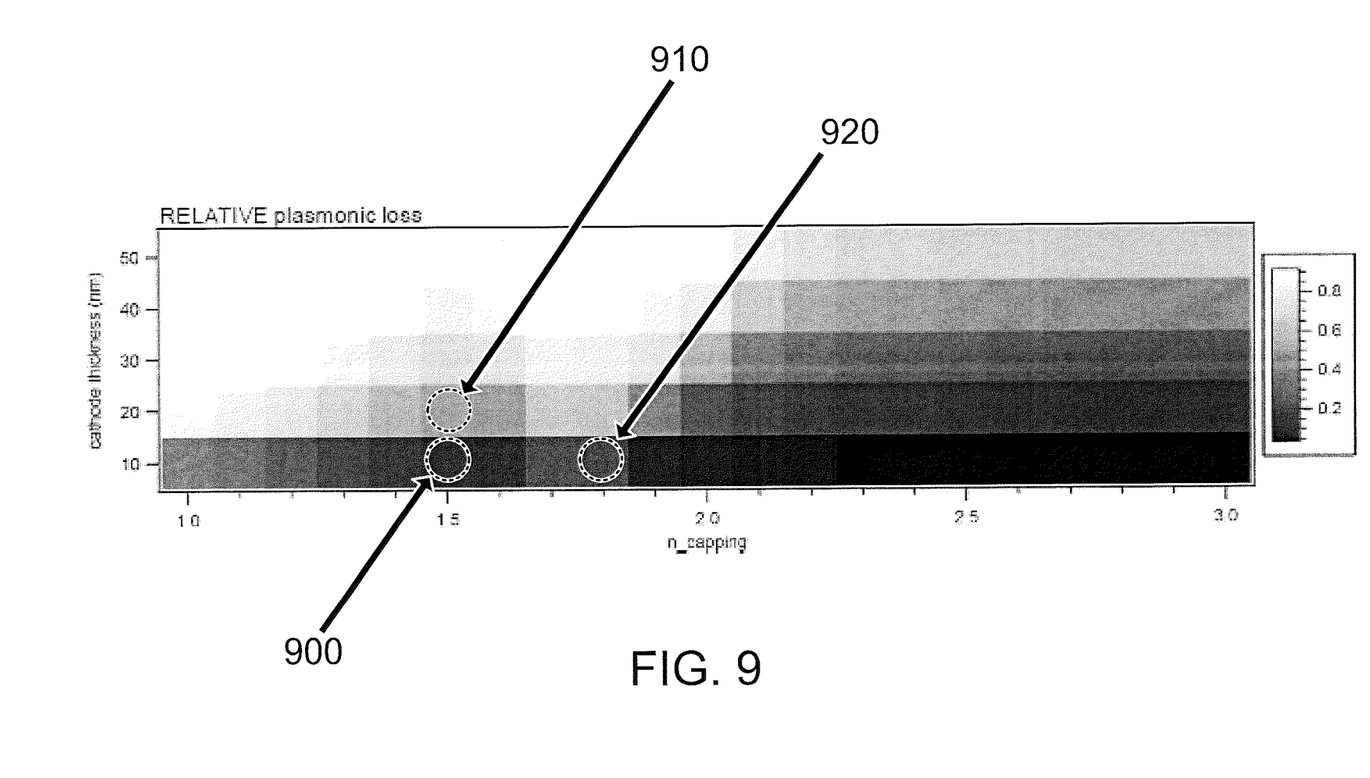
FIG. 9 shows a plot of simulation data in accordance with one or more embodiments of the invention.

FIG. 9 shows a plot of the relative plasmonic loss percentage for the aforementioned ranges of the refractive index of the first half space (600, FIG. 6A) and the thickness of the metal layer (630, FIG. 6A). The horizontal axis corresponds to the refractive index and the vertical axis corresponds to the thickness. Each cell of the plot includes a grayscale shade corresponding to the magnitude of the relative plasmonic loss. Darker shades indicate less loss while lighter shades indicate higher loss.

As seen in FIG. 9, the relative plasmonic loss generally decreases as the thickness of the metal layer (630, FIG. 6A) decreases. For example, at the first marked location (900, cathode thickness=10 nm, n_capping=1.5), the relative plasmonic loss is 17%. At the second marked location (910, cathode thickness=20 nm, n_capping=1.5), the relative plasmonic loss is 54%.

Additionally, as seen in FIG. 9, the relative plasmonic loss generally decreases as the difference between the refractive index of the first half space (600, FIG. 6A) and the refractive index of the second half space (610, FIG. 6A) increases. For example, the relative plasmonic loss at the first marked location (900, cathode thickness=10 nm, n_capping=1.5) is 17%. At the third marked location (920, cathode thickness=10 nm, n_capping=1.8), the relative plasmonic loss is 26%.

Figure 10:
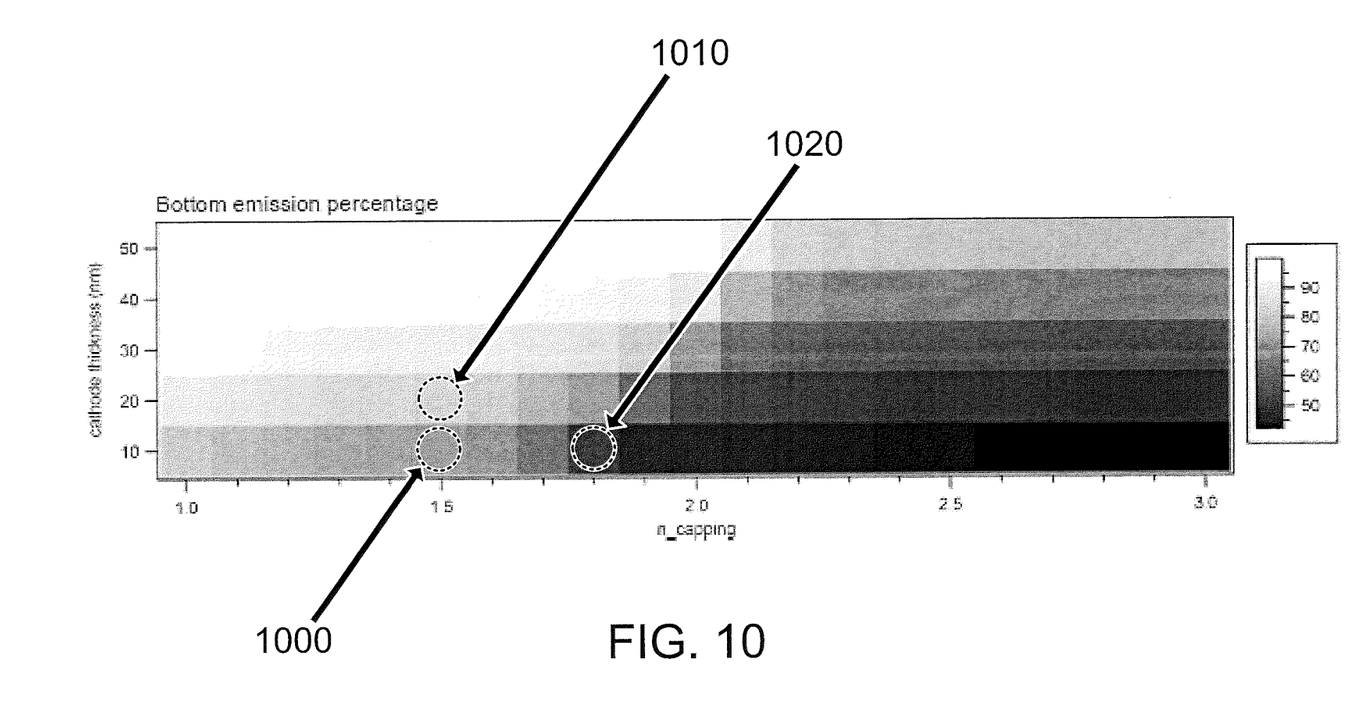
FIG. 10 shows a plot of simulation data in accordance with one or more embodiments of the invention.

FIG. 10 shows a plot of the bottom emission percentage for the aforementioned ranges of the refractive index of the first half space (600, FIG. 6A) and the thickness of the metal layer (630, FIG. 6A). The horizontal axis corresponds to the refractive index and the vertical axis corresponds to the thickness. Each cell of the plot includes a grayscale shade corresponding to the magnitude of the bottom emission percentage. Darker shades indicate less bottom emission percentage.

As seen in FIG. 10, the bottom emission percentage generally increases as the thickness of the metal layer (630, FIG. 6A) increases. For example, at the first marked location (1000, cathode thickness=10 nm, n_capping=1.5), the bottom emission percentage is 75%. At the second marked location (1010, cathode thickness=20 nm, n_capping=1.5), the bottom emission percentage is 85%.

Additionally, as seen in FIG. 10, the bottom emission percentage generally increases as the refractive index of the first half space (600, FIG. 6A) decreases. For example, at the first marked location (1000, cathode thickness=10 nm, n_capping=1.5), the bottom emission percentage is 75%. At the third marked location (1020, cathode thickness=10 nm, n_capping=1.8), the bottom emission percentage is 54%.

The simulation results as plotted in FIG. 9 and FIG. 10 indicate that by choosing a combination of the thickness of the thin metal film cathode and the refractive index of the capping layer (e.g., 910 in FIG. 9, 1010 in FIG. 10, cathode thickness=20 nm, n_capping=1.5), a light emitting device in accordance with one or more embodiments of the invention may achieve a relative plasmonic loss of less than 60%, i.e., larger than 40% reduction of plasmonic loss compared with a light emitting device having a bulk (or thick) cathode, as known in the art, and at the same time maintain a bottom emission percentage of larger than 85%. Thus, for example, one or more embodiments of the invention can be directly applied for a bottom emitting light emitting device for reducing the plasmonic energy loss without a need of a mirror layer on the top of the capping layer, as known in the art. Thus, for example, one or more embodiments of the invention may provide a bottom emitting light emitting device having a reduced plasmonic energy loss when compared to a bottom emitting light emitting device having the bulk (or thick) cathode.

Additionally, one or more embodiments of the invention may also be combined with other techniques for enhancing light extraction from other light lost channels, e.g., waveguide mode, substrate mode.

Figure 11:
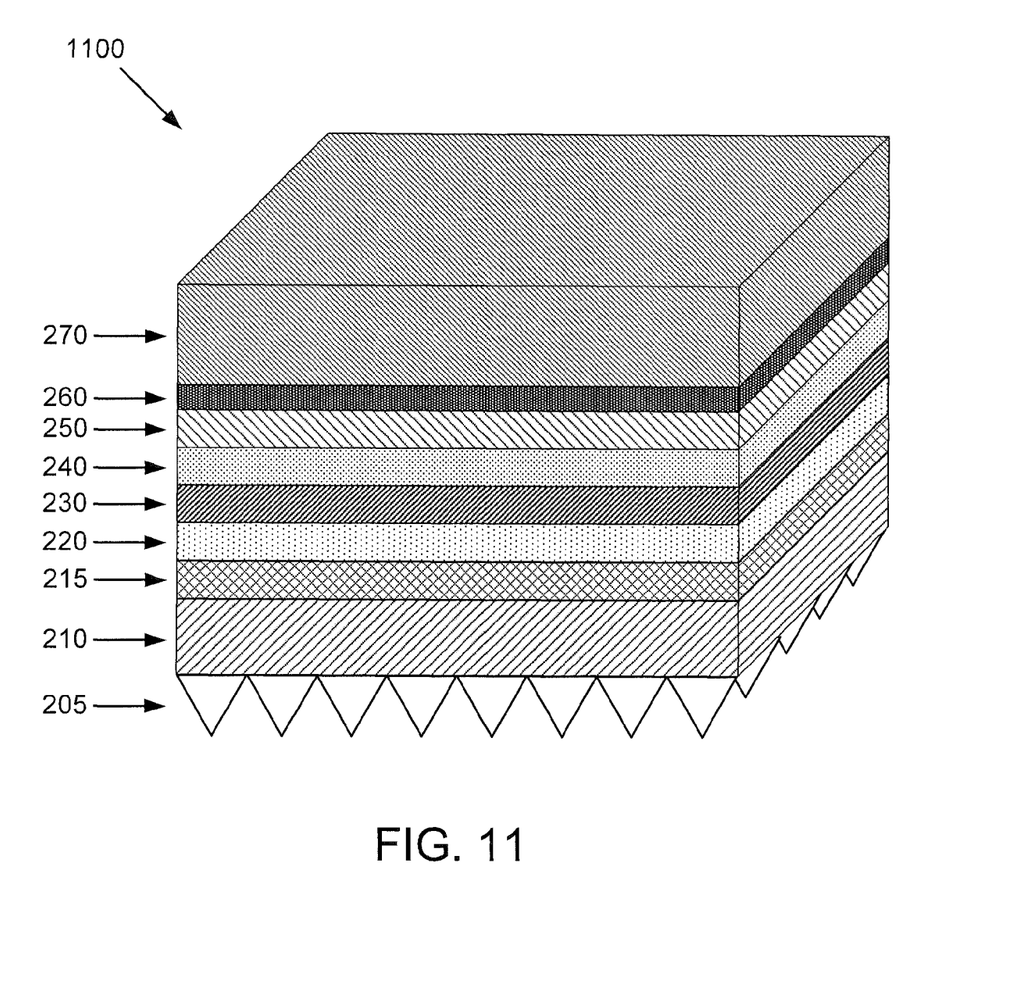
FIG. 11 shows a light emitting device in accordance with one or more embodiments.

For example, FIG. 11 shows a light emitting device (1100) in accordance with one or more embodiments of the invention. Specifically, FIG. 11 shows the light emitting device of FIG. 2 including two additional layers. The light emitting device (1100) may include an internal extraction structure (IES) (215). The internal extraction structure (215) may include a number of high refractive index particles (not shown). When light traverses the internal extraction structure (215) the light may be scattered by the high index of refraction particles. By scattering the light, the internal extraction layer (215) may enhance the light extraction from a waveguide mode. The light emitting device (1100) may also include a microlens array at the bottom surface of the substrate (205). The microlens array layer (205) may enhance light extraction from a substrate mode, as discussed above.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A bottom emitting light emitting device, comprising:
   a substrate configured to emit light;
   a first electrode disposed on the substrate;
   a light emission layer (EML) disposed on the first electrode;
   a second electrode disposed on the EML; and
   a capping layer disposed on the second electrode,
   wherein a thickness of the second electrode is not more than 50 nm,
   wherein a refractive index of the capping layer is less than a refractive index of the EML, and
   wherein the EML and the second electrode are separated by a distance not more than 100 nm.

2. The light emitting device of claim 1, further comprising:
   a hole transport layer disposed between the first electrode and the EML; and
   an electron transport layer disposed between the EML and the second electrode, wherein a thickness of the electron transport layer is less than 100 nm.

3. The light emitting device of claim 2, wherein refractive index of the capping layer is less than a refractive index of the electron transport layer.

4. The light emitting device of claim 3, wherein the thickness of the second electrode is between 10 nm and 30 nm.

5. The light emitting device of claim 4, wherein the capping layer is a dielectric layer and the refractive index of the capping layer is between 1.4 and 1.6.

6. The light emitting device of claim 5, wherein a thickness of the capping layer is greater than or equal to 650 nm.

7. The light emitting device of claim 6, wherein the capping layer is silicon dioxide, barium fluoride, calcium fluoride, aluminum oxide, potassium bromide, polymethyl methacrylate, polyacrylate, or polycarbonate.

8. The light emitting device of claim 2, wherein the thickness of the second electrode is between 10 nm and 30 nm.

9. The light emitting device of claim 8, wherein the capping layer is a dielectric layer and the refractive index of the capping layer is between 1.4 and 1.6.

10. The light emitting device of claim 9, wherein a thickness of the capping layer is greater than or equal to 650 nm.

11. The light emitting device of claim 10, wherein the capping layer is silicon dioxide, barium fluoride, calcium fluoride, aluminum oxide, potassium bromide, polymethyl methacrylate, polyacrylate, or polycarbonate.

12. The light emitting device of claim 2, further comprising:
an internal extraction structure disposed between the substrate and the first electrode, wherein the internal extraction structure comprises high refractive index particles and extracts light from a waveguide mode.

13. The light emitting device of claim 2, further comprising:
a microlens array formed on a surface of the substrate opposite the first electrode, wherein the microlens array extracts light from a substrate mode.

14. The light emitting device of claim 1, wherein the second electrode is silver.

15. The light emitting device of claim 1, wherein the thickness of the second electrode is between 10 nm and 30 nm.

16. The light emitting device of claim 15, wherein the capping layer is a dielectric layer and the refractive index of the capping layer is between 1.4 and 1.6.

17. The light emitting device of claim 16, wherein a thickness of the capping layer is greater than or equal to 650 nm.

18. The light emitting device of claim 17, wherein the capping layer is silicon dioxide, barium fluoride, calcium fluoride, aluminum oxide, potassium bromide, polymethyl methacrylate, polyacrylate, or polycarbonate.

19. The light emitting device of claim 1, further comprising:
an internal extraction structure disposed between the substrate and the first electrode, wherein the internal extraction structure comprises high refractive index particles and extracts light from a waveguide mode.

20. The light emitting device of claim 1, further comprising:
a microlens array formed on a surface of the substrate opposite the first electrode, wherein the microlens array extracts light from a substrate mode.

21. A light emitting device, comprising:
a substrate through which a majority of light generated by a light emission layer (EML) is radiated;
a first electrode disposed on the substrate;
the EML, disposed on the first electrode, that generates the light;
a second electrode disposed on the EML; and
a capping layer disposed on the second electrode,
wherein a thickness of the second electrode is not more than 50 nm,
wherein a refractive index of the capping layer is less than a refractive index of the EML, and
wherein the EML and the second electrode are separated by a distance not more than 100 nm.

22. A light emitting device, comprising:
a substrate;
a first electrode, disposed on the substrate, configured to transmit light generated by a light emission layer (EML) to the substrate;
the EML disposed on the first electrode;
a second electrode disposed on the EML; and
a capping layer disposed on the second electrode,
wherein a thickness of the second electrode is not more than 50 nm,
wherein a refractive index of the capping layer is less than a refractive index of the EML, and
wherein the EML and the second electrode are separated by a distance not more than 100 nm.

* * * * *